United States Patent
Jakobsson et al.

(10) Patent No.: US 6,654,596 B1
(45) Date of Patent: Nov. 25, 2003

(54) HOMODYNE RADIO RECEIVER HAVING DC COMPENSATION

(75) Inventors: Jan Peter Jakobsson, Lund (SE); Sven Erik Niklas Stenström, Helsingborg (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/492,381

(22) Filed: Jan. 27, 2000

(30) Foreign Application Priority Data

Jan. 27, 1999 (SE) ................................. 9900289

(51) Int. Cl.[7] ............................................. H04B 1/26
(52) U.S. Cl. ...................................... 455/324; 445/323
(58) Field of Search ................. 455/324, 278.1, 455/317, 208, 202, 214, 222, 228, 234.2, 236.1, 251.1, 256, 277.2, 284, 305; 375/319, 322, 340; 329/300, 304

(56) References Cited

U.S. PATENT DOCUMENTS

| 4,873,702 A | 10/1989 | Chiu |
| 4,979,230 A | 12/1990 | Marz |
| 5,241,702 A | 8/1993 | Dent |
| 5,568,520 A | * 10/1996 | Linquist et al. ............. 375/344 |
| 5,697,085 A | 12/1997 | Birth et al. |
| 5,749,051 A | * 5/1998 | Dent ........................... 455/324 |
| 5,838,735 A | 11/1998 | Khullar |
| 6,370,205 B1 | * 4/2002 | Lindoff et al. .............. 375/319 |
| 2002/0071506 A1 | * 6/2002 | Linquist et al. ............. 375/344 |

FOREIGN PATENT DOCUMENTS

| EP | 0611057 A2 | 8/1994 |
| JP | 4-81137 A | 7/1990 |

* cited by examiner

*Primary Examiner*—William Trost
*Assistant Examiner*—Naghmeh Mehrpour
(74) *Attorney, Agent, or Firm*—Burns, Doane, Swecker & Mathis, L.L.P.

(57) ABSTRACT

A homodyne radio receiver apparatus receives radio frequency signal bursts containing a number of symbols and generates digital samples of at least a complex base band signal (I and Q) of each signal burst. A DC compensator comprises an average calculator (8,8'), which determines an average DC-level of said samples, and a signed square sum calculator (9,9'), which calculates a signed square sum of a plurality of said samples and weights the square sum by a compensation factor. Correction means (10,10') subtracts the square sum from an output of said average calculator means for forming the DC-level estimate.

20 Claims, 13 Drawing Sheets

HOMODYNE RADIO RECEIVER HAVING DC COMPENSATION

This application claims priority under 35 U.S.C. §§119 and/or 365 to 9900289-1 filed in Sweden on Jan. 27, 1999; the entire content of which is hereby incorporated by reference.

FIELD OF THE INVENTION

The present invention relates generally to a homodyne radio receiver apparatus and more particularly to a homodyne radio receiver apparatus, comprising DC compensation means for determining a DC-level estimate of a received signal burst.

DESCRIPTION OF THE PRIOR ART

Homodyne receivers are well known for use in wireless telecommunication devices, such as mobile telephones.

Generally, a homodyne receiver comprises dual communication channels, which are commonly known as I and Q channels. The dual-channel homodyne receiver is used in prior art digital mobile telephones, such as GSM phones.

The receiver comprises an antenna for receiving an incoming electromagnetic communication signal, such as a TDMA signal ("Time Division Multiple Access") representing a stream of digital data symbols, which have been modulated onto two orthogonal carrier waves. The received signal is fed through a bandpass filter, amplified in an amplifier and then split into two identical signals. The first of these signals goes to a first signal path, where it is initially mixed in a mixer with an intermediate frequency signal. The intermediate frequency signal is fed from a local oscillator and passes unmodified through a phase shifter. Similarly, the second signal goes to a second signal path, where it is mixed in a mixer with the intermediate frequency signal from the local oscillator, once the phase of the intermediate frequency signal has been shifted by 90° in the phase shifter.

The output of the mixer is filtered by a lowpass filter and amplified in a second amplifier. Subsequently, the signal is fed to an analog-to-digital converter for sampling the signal and converting it to a digital signal comprising the stream of data symbols. The digital signal is filtered in a digital lowpass filter, and the digital data symbols contained in the signal are supplied to a digital memory. An estimated DC-level of the signal is determined and subtracted from the digital signal forming a DC-level compensated digital signal, which is demodulated.

The stream of digital data symbols are subsequently used by other components in the mobile telephone for producing e.g. an audible output through a loudspeaker.

However, it has been found that prior art homodyne radio receivers have insufficient receiver performance, particularly for representing data messages sent between two computers during a data communication session.

The information bandwidth of a homodyne receiver goes down to DC in frequency, but the DC-level contains no information. Hence, the DC-level needs to be removed before the information can be demodulated properly.

The DC-level of a signal can be estimated in different ways. One way of estimating the DC-level is disclosed in U.S. Pat. No. 5,838,735, wherein the DC-level of a signal is determined by means of an average calculator, which calculates the mean value or the average DC-level of the digital signal according to the following expression:

$$DClevel = 1/N \Sigma_{i=1}^{N} S \qquad (i)$$

Hence, the mean value of the samples S(i) is determined by forming the average of a predetermined number N of the most recently received samples. Then, the average DC-level is subtracted from the digital signal forming a DC-level compensated digital signal.

In TDMA systems like GSM it is difficult to determine the DC-level, because the time to measure the DC-level is limited to one received burst, since the next received burst can have another DC-level due to for instance frequency hopping. The number of samples included in an average calculation is for example 128 bits. This implies the assumption that, the average of 128 GMSK (Gaussian Minimum Shift Keying) modulated I samples (or Q samples) is zero. However, averages equal to zero is only the case when signal points are positioned equally frequent in all quadrants in the IQ plane.

An investigation shows that the modulation in some cases causes a DC offset of more than 20% (typically 10%) of the amplitude for 128 samples. Such, DC-level estimates causes a limited performance for high C/I (carrier-to-interference ratio) and SNR (signal-to-noise ratio) signals, and an unsatisfying number of bit errors, particularly when the signals are uses for transmitting data during a data communication session. Of course, the accuracy in the DC-level estimate is also dependent on the modulation type.

SUMMARY OF THE INVENTION

An object of the present invention is to provide a homodyne radio receiver apparatus and method, providing an improved DC-level estimate and compensation.

This object is achieved by a homodyne radio receiver apparatus according to the invention, wherein a radio frequency signal burst of a number of symbols is received in the apparatus and converted to digital samples for DC compensation by a DC compensator. A first estimate of the DC-level is determined by calculating an average DC-level of the samples in an average calculator.

Then, according to one aspect of the invention, a signed square sum of a plurality of the samples are calculated by a signed square sum calculator in the DC compensator. The square sum is weighted by a compensation factor, and correction means connected to the square sum calculator subtracts the weighted square sum from the average DC-level for forming an improved DC-level estimate.

According to another aspect of the invention, the DC compensation means comprises a signed sum calculator for calculating a signed sum of a plurality of the samples and weighting the sum by a compensation factor. Correction means is also included in the DC compensation means, wherein an output of the signed sum calculator means is subtracted from an output of the average calculator means for forming the DC-level estimate.

An introduction of a DC compensator, which estimates a DC-level as described and compensates the signal with a parameter dependent on the signal shape, the output from the function will become correlated with the error in the DC-level estimate. The function extracts information from the signal, which can be used to compensate for any error in the DC-level estimate.

An advantage of the present invention is that the DC-level estimate and compensation according to the invention removes the limiting DC-level error for high C/I (carrier-to-interference ratio) and SNR (signal-to-noise ratio) signal conditions, by considering information characteristics of the signal for DC-level estimation, resulting in a reduced number of bit errors for the current signal conditions.

BRIEF DESCRIPTION OF THE DRAWINGS

In order to explain the invention in more detail and the advantages and features of the invention references in the following detailed description of the preferred embodiment are made to the accompanying drawings, in which.

DETAILED DESCRIPTION OF THE INVENTION

Figure 1A:
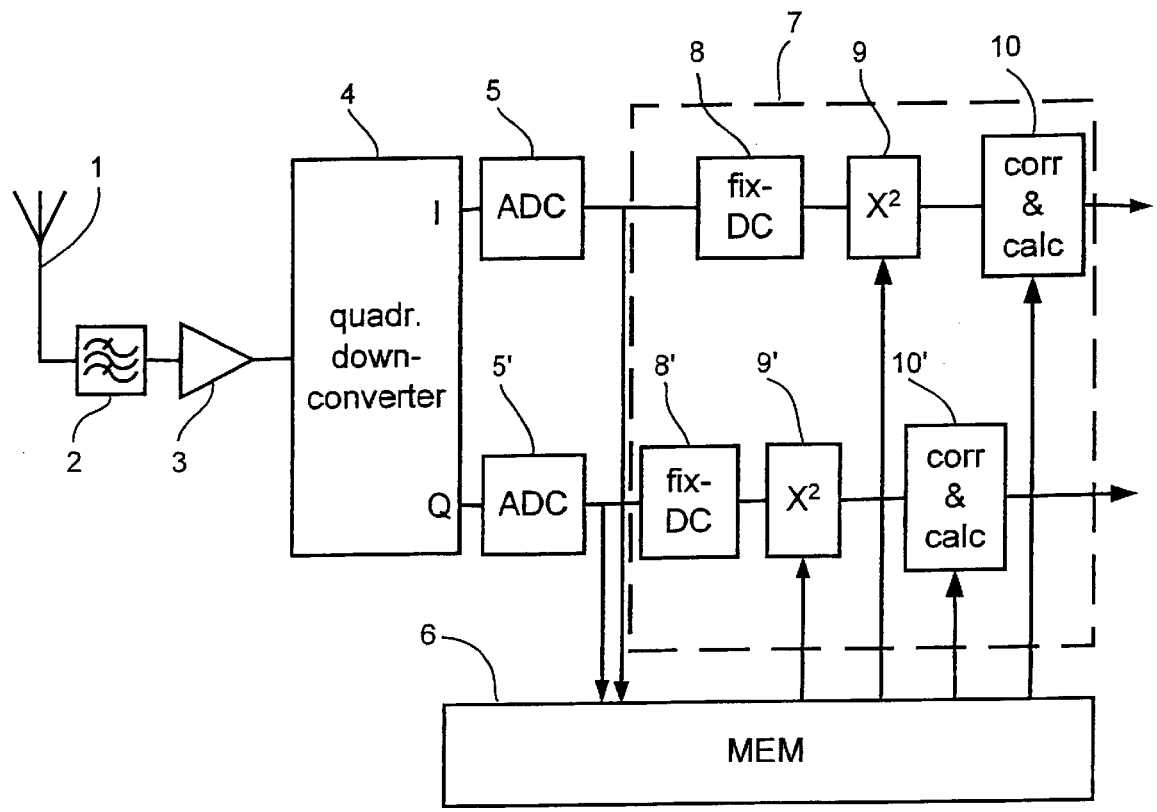
FIG. 1A is a block diagram of a first embodiment of a, homodyne receiver according to the invention.

One embodiment of a homodyne radio receiver apparatus according to the invention, which estimates a DC-level of received radio frequency signal bursts and removes the estimated DC-level of each burst before the signal is demodulated, is shown in a schematical block diagram in FIG. 1.

A signal burst containing a number of symbols, including a carrier signal modulated by a modulating signal, is received by an antenna 1 and is filtered by a bandpass filter 2. An amplifier 3 amplifies the filtered signal generated by the filter 2. Further, the amplified signal burst is down-converted to complex base band signals I (in-phase) and Q (quadrature) by a conventional quadrature down-converter 4. The output I, Q from the down-converter 4 is preferably filtered and amplified by additional filters and amplifiers before the output is sampled and converted to a digital signal by an analog-to-digital converter ADC 5,5'. The digital signal may be filtered in a digital filter, and the digital data symbols or samples contained in the signal are supplied to a digital memory 6 for later retrieval.

The output from the ADC 5,5' is fed to a DC compensation device 7, which determines a DC-level estimate of the received signal and subtracts the determined DC-level from the signal burst before it is demodulated. In order to determine the DC-level estimate the DC compensation device is adapted to process the received signal burst in a plurality of steps according the invention. The output of the ADC 5,5' is fed to an average calculator 8,8', which estimates the average DC-level of a number of samples. Additionally, the average calculator 8,8' determines the peak value of the signal by identifying the maximal sample value and subtracting the estimated average DC-level from the maximal sample value. The peak value is supplied to the next step of the signal path together with the estimated average DC-level.

The next step in the signal path is a square sum calculator 9,9'. The samples of the received signal burst stored in the digital memory 6 are read by the square sum calculator 9,9', which standardizes the symbols with reference to the estimated average DC-level and the peak. value before a signed square sum of the samples are calculated and weighted by a compensation factor, described later. Then, a final DC-level estimate is calculated in the square sum calculator 9,9' by subtracting the weighted calculated signed square sum.

Further, the output of the square sum calculator 9,9' is supplied to a correction and calculator block 10,10', in which an improved DC-level estimate is calculated by subtracting the weighted calculated signed square sum from the estimated average DC-level. Finally, the improved DC-level estimate is subtracted from each sample read from the memory 6. In an alternative embodiment of the invention, the subtraction of the weighted calculated signed square sum from the estimated average DC-level is performed by the square sum calculator 9,9'.

Consequently, the output of the correction and calculator block 10,10' at the end of the signal path will finally provide a first part of the stream of digital data symbols, that were contained in and carried by the analog signal initially received at the antenna 1. The stream of digital data symbols are subsequently used by other components in the mobile telephone for producing e.g. an audible output through a loudspeaker, such as speech Alternatively, the stream of digital data symbols may represent data messages sent between two computers during a data communication session.

The randomness of the wanted signal, i.e the modulating signal, and the number of symbols used for the estimate, effects the error in the DC-level calculation. For the purpose of illustration, the wanted signal is a randomly GMSK (Gaussian Minimum Shift Keying) modulated signal. The maximum number of symbols to calculate the mean value is set by the burst length.

The above mentioned limits will degrade the performance.

Hence, according to the invention, the error in the DC-level estimate is minimized if the DC-level is compensated with information inherent in the signal burst.

In this embodiment of the invention, the DC-level is estimated according to the following expression (1) for the compensation:

$$DC_{estimate1} = DC_{average} - A \cdot DC_{error1} \qquad (1), \text{wherein}$$

$$DC_{average} = \frac{1}{N} \sum_{i=1}^{N} S(i), \quad \text{and} \qquad (2)$$

$$DC_{error1} = \frac{1}{N} \cdot \sum_{N} |x| \cdot x \qquad (3)$$

Thus, the estimated DC-level, $DC_{estimate1}$, is the average DC-level, $DC_{average}$, calculated over N symbols S(i) compensated by a DC-error, $DC_{error1}$, multiplied by a compensation factor A. The DC-error is estimated by calculating the signed square sum of the signal, wherein $x = S(i) - DC_{average}$.

An optimal compensation factor, i.e the relationship between the DC-error and the signed square sum, is determined for different C/I (carrier-to-interference ratio) and SNR (signal-to-noise ratio), assuming white noise.

Figure 2:
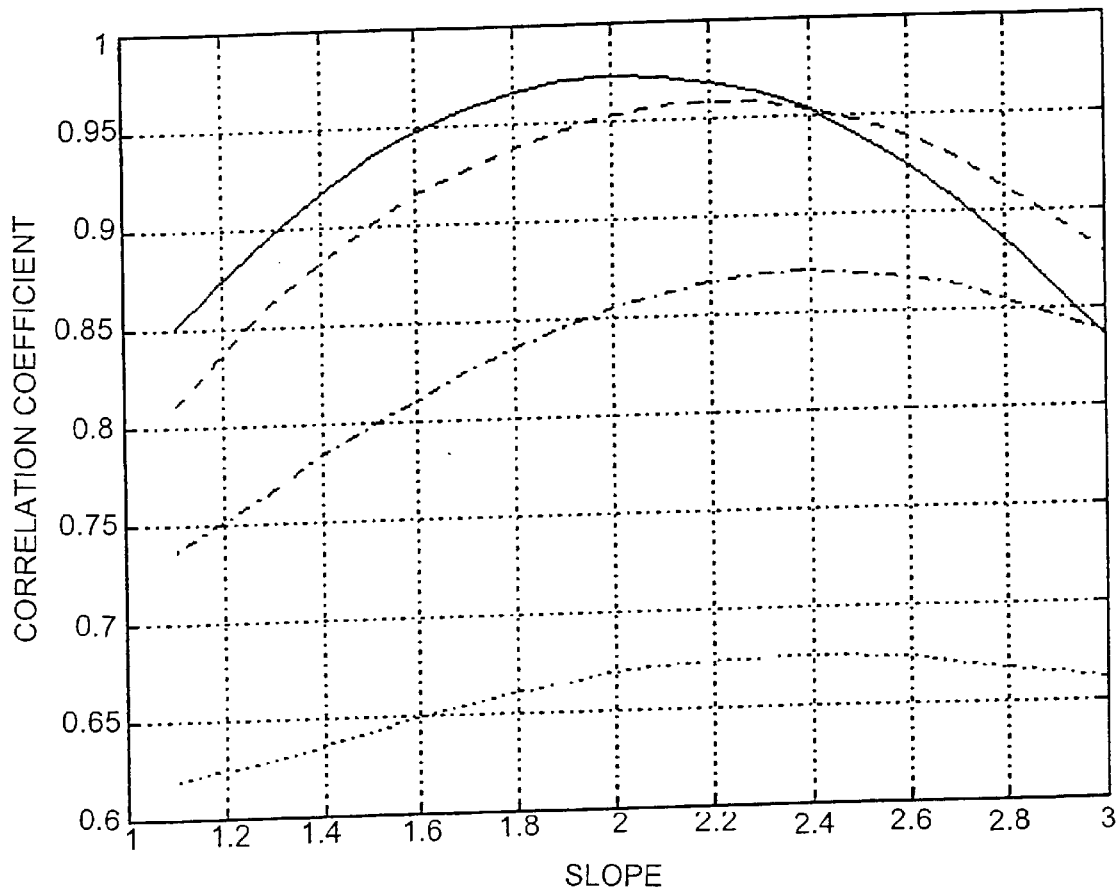
FIG. 2 shows the integrated area of the DC-error probability function between −5 to +5% as a function of the slope in the compensation equation.

With reference to the graphs in FIG. 2, the integrated area of the DC-error probability function between −5 to +5% is shown as a function of the slope, i.e the compensation factor, in the expression (1). The solid line illustrates C/I>100 dB, the dashed line C/I=20 dB, and the dash-dotted line C/I=12 dB, and the dotted line C/I=6 dB.

Figure 3:
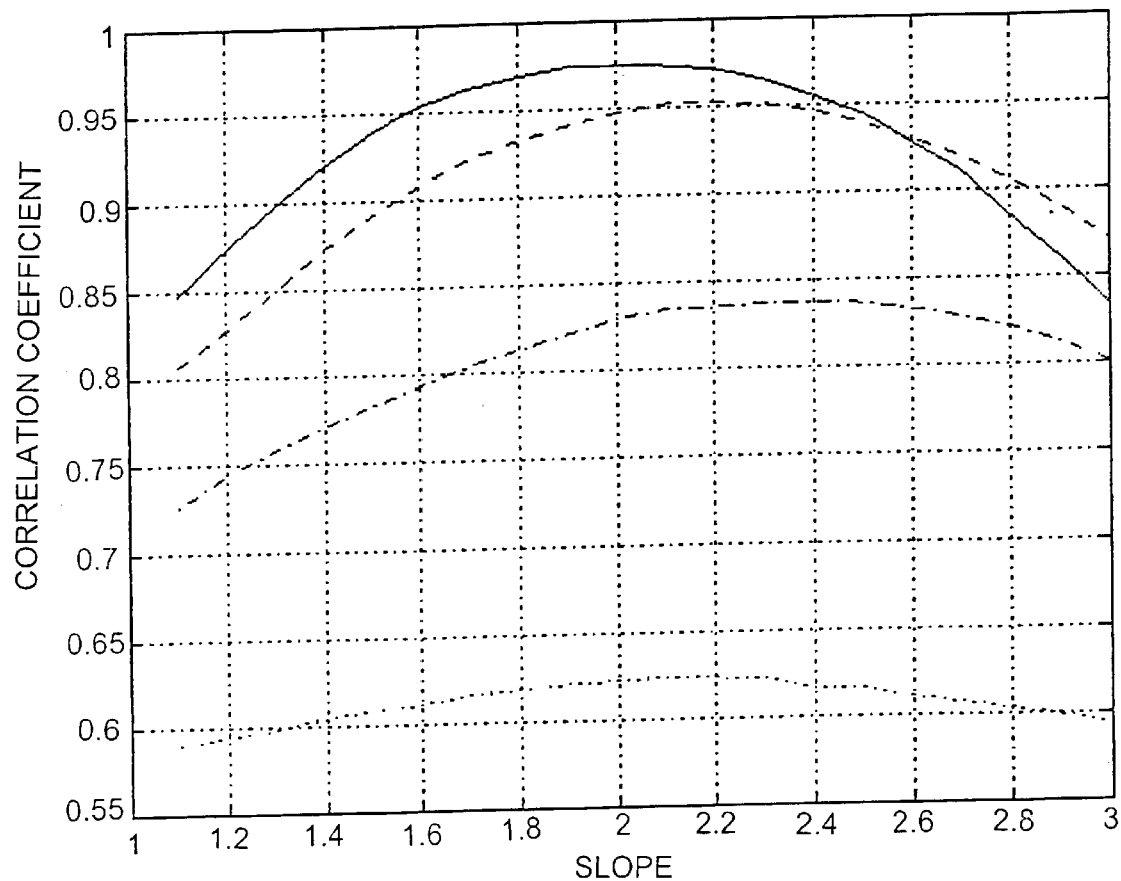
FIG. 3 shows the integrated area of the DC-error probability function between −5 to +5% as a function of the slope in the compensation equation.

FIG. 3 shows graphs representing the integrated area of the DC-error probability function between −5 to +5% as a function of the slope, i.e the compensation factor, in the expression (1). The solid line illustrates SNR>100 dB, the dashed line SNR=200 dB, the dash-dotted line SNR=12 dB, and the dotted line SNR=6 dB.

According to the graphs in FIGS. 2 and 3, it is apparent that a value of 2.0 is an optimal slope. Hence, a compensation factor A of −1.0 to −3.0 and preferably −2.0 is an optimal relationship between the DC-error and the signed square sum for a high C/I. Thus, the following expression is an example of a compensation expression used by the DC compensation device 7 for determining a DC-level estimate.

$$DC_{estimate1} = DC_{average} + 2 \cdot DC_{error1} \quad (4)$$

The flatness of the optimum indicates that this parameter is noise tolerant.

Figure 4:
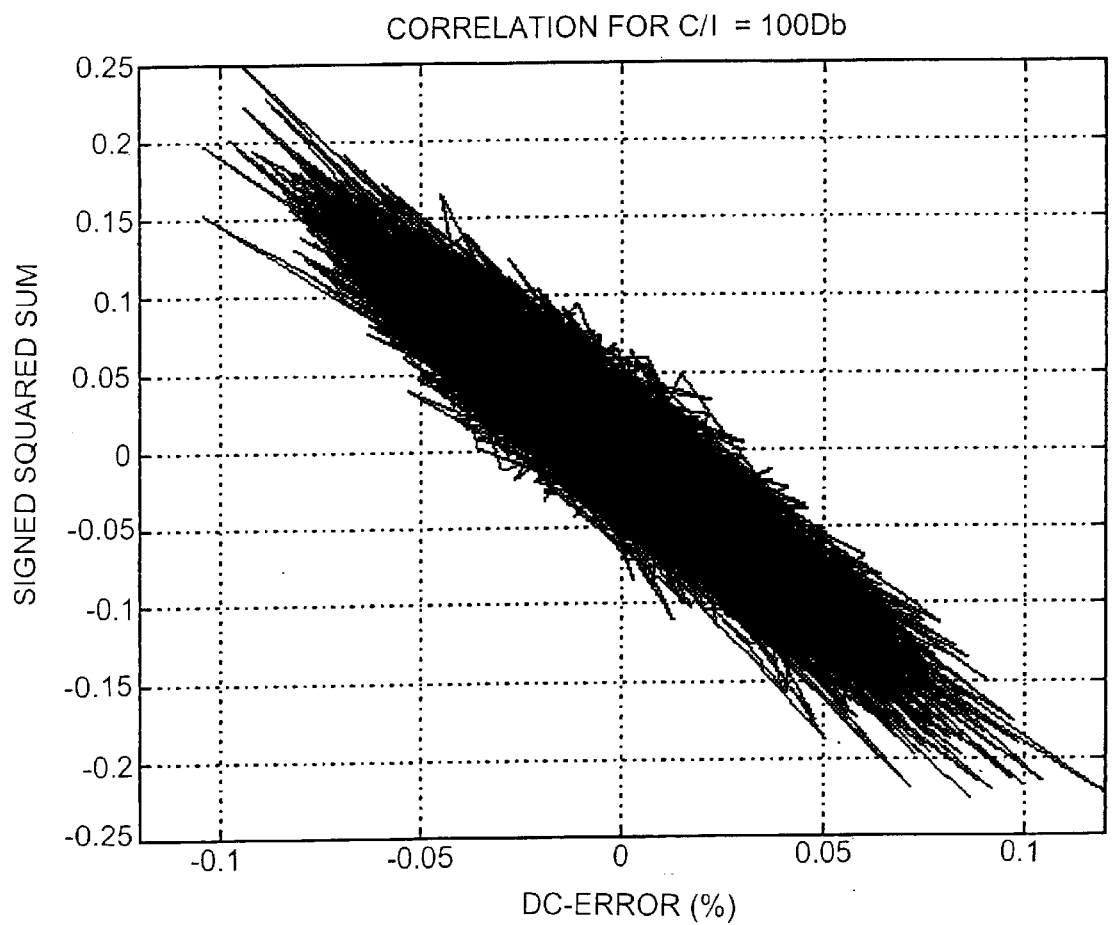
FIG. 4 is a plot of the correlation for C/I>100 dB.
Figure 5:
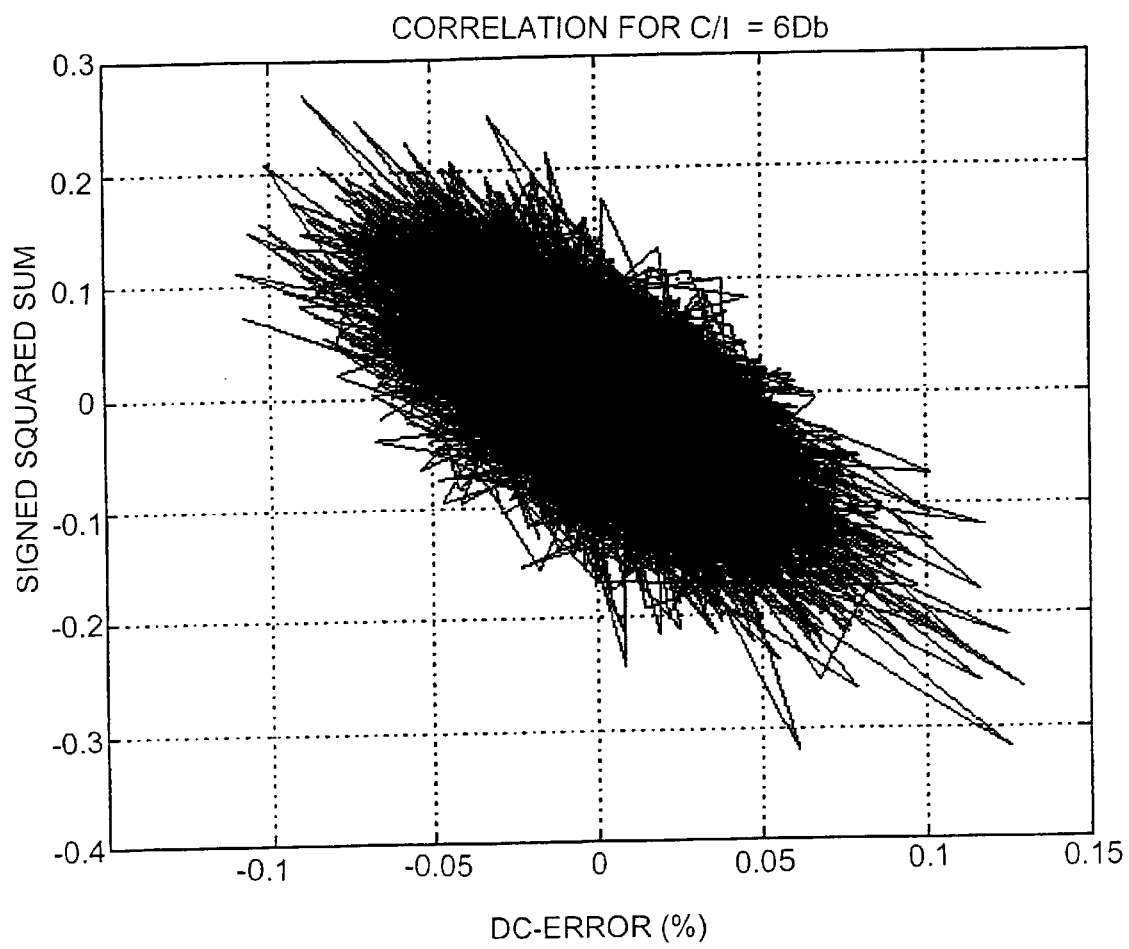
FIG. 5 is a plot of the correlation for C/I=6 dB.

FIG. 4 is a plot of the correlation for C/I>100 dB and FIG. 5 is a plot of the correlation for C/I=6 dB.

With reference to FIGS. 4 and 5 it is apparent that the correlation plot will become more and more like a circle for worse C/I, and, consequently, the optimum slope will then of course become less critical.

Figure 6:
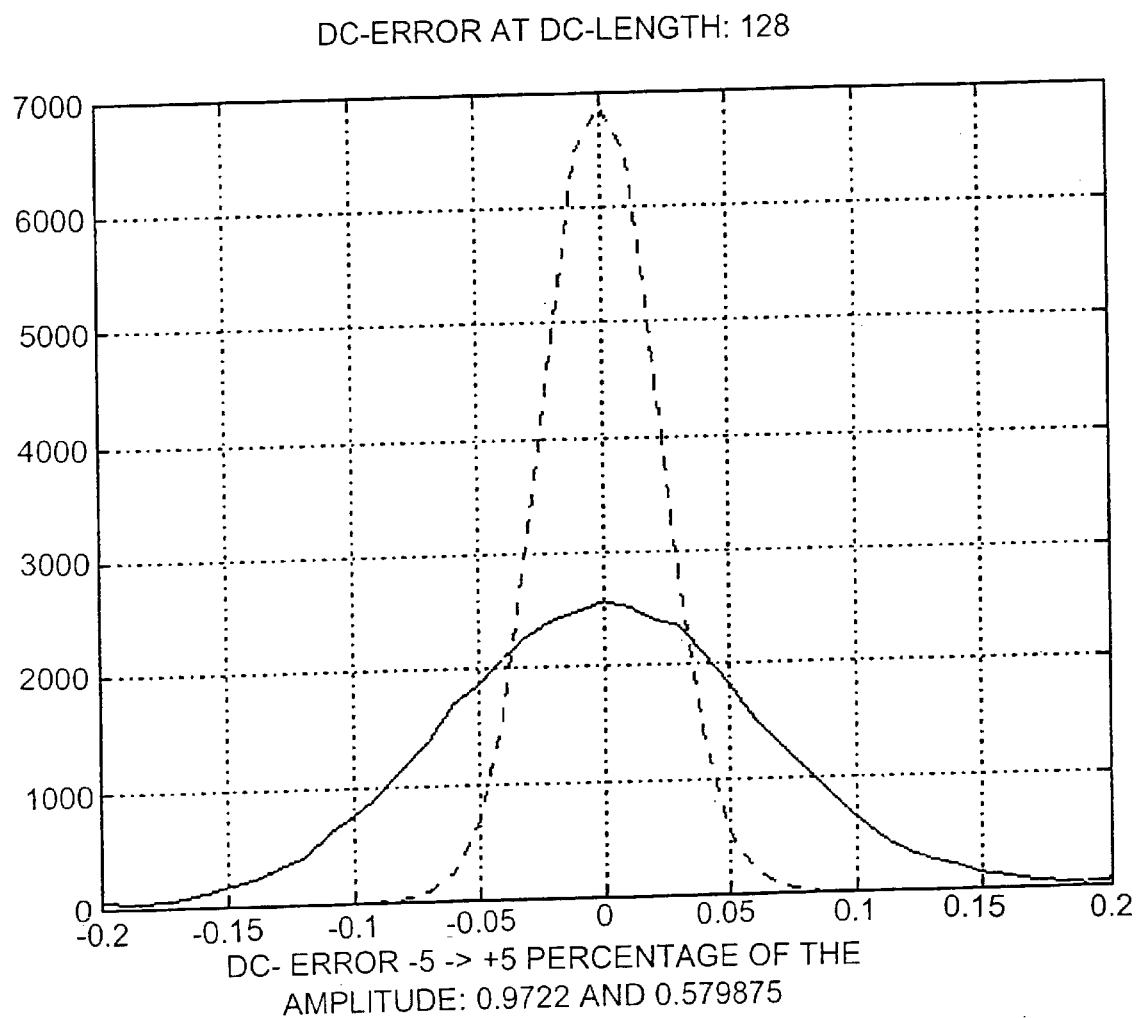
FIG. 6 is a plot of the probability functions for the DC error with and without compensations for C/I>100 dB.

The probability functions for the DC error (as percentage of the amplitude) estimated from a burst of 128 symbols for C/I>100 dB are illustrated in FIG. 6. The solid line illustrates the probability function without compensation and the dashed line illustrates the probability function with a compensation slope value of 2 (compensation factor).

Figure 7:
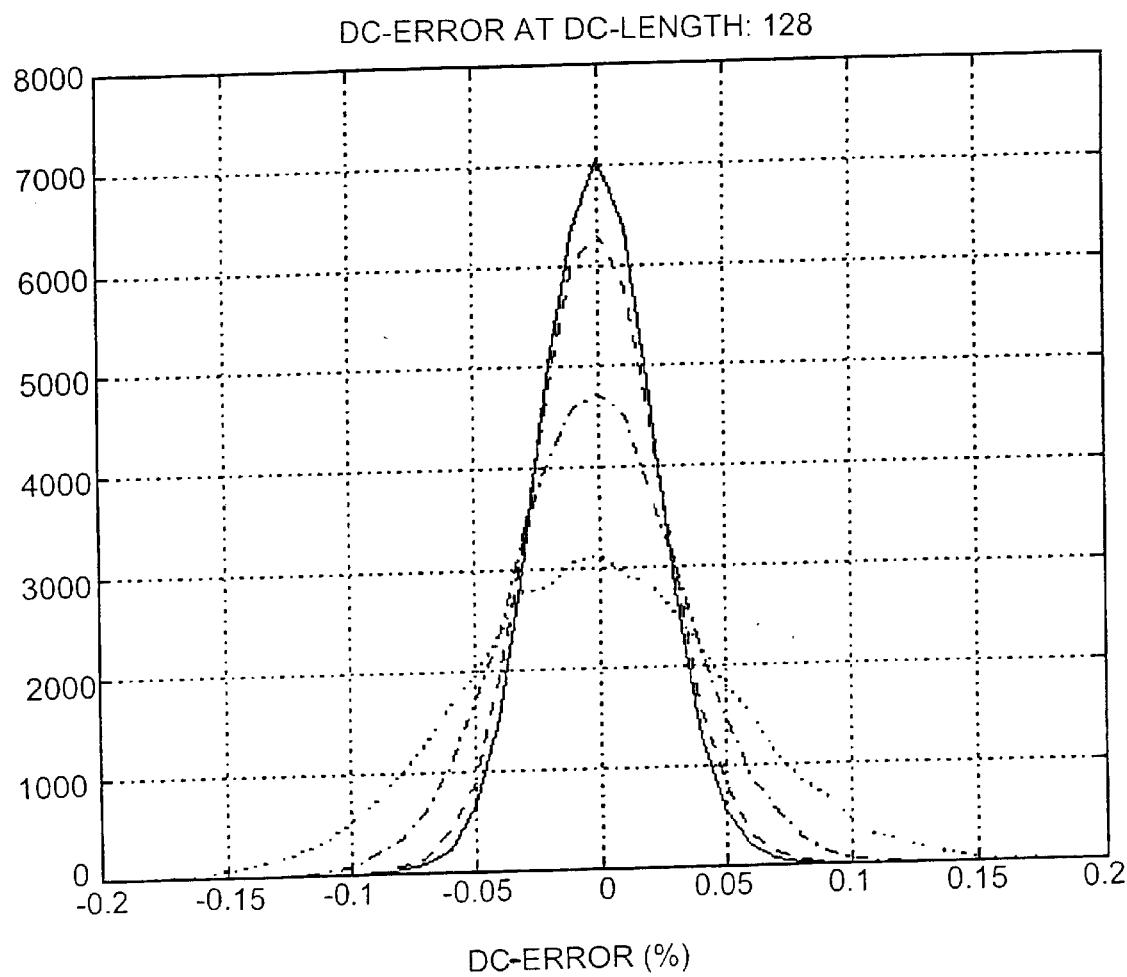
FIG. 7 shows the compensated probability function for different C/I.

FIG. 7 shows probability functions as a result of the compensation according to the invention for different C/I: Solid line C/I>100 dB, Dashed line C/I=20 dB, Dash-dotted C/I=12 dB and Dotted C/I=6 dB.

Figure 8:
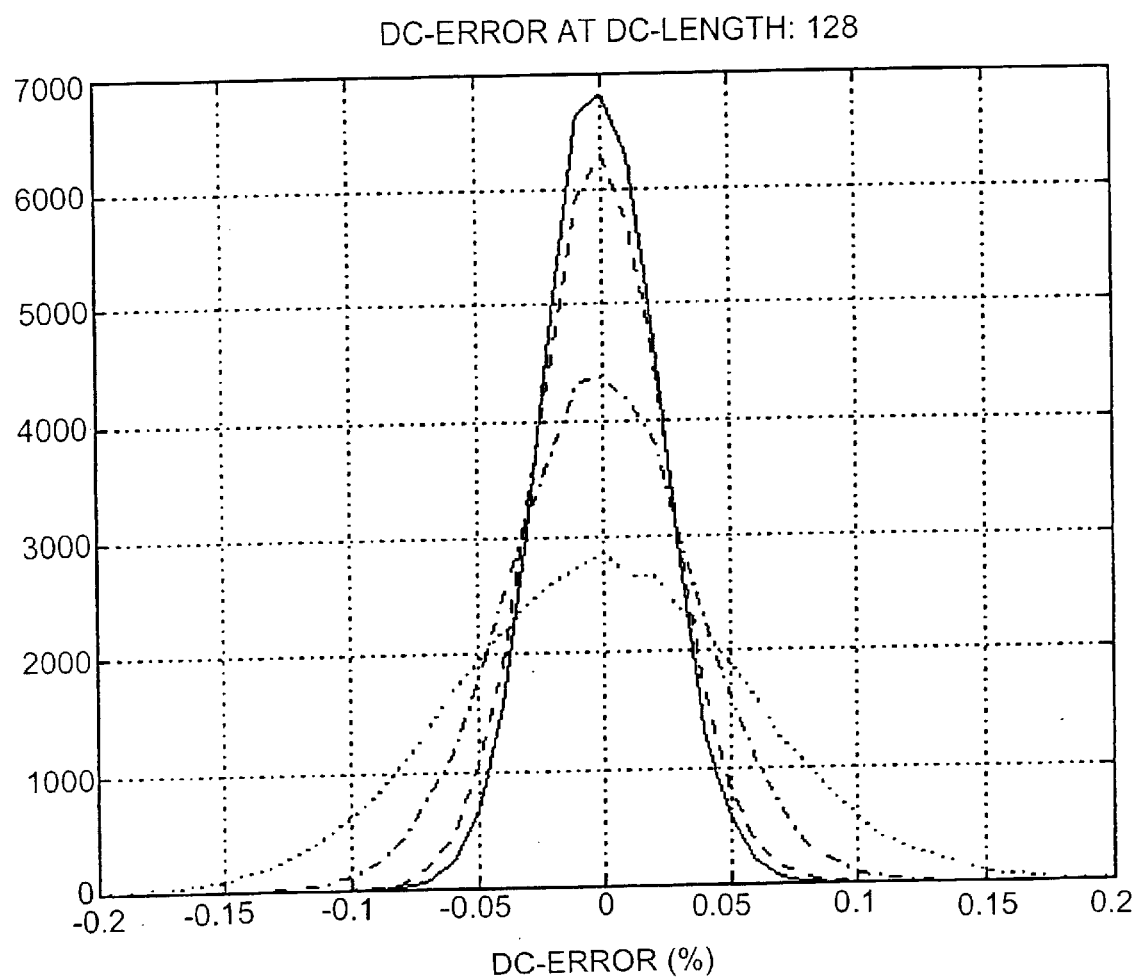
FIG. 8 shows the compensated probability function for different C/I.

FIG. 8 shows the compensated probability function for different SNR: Solid line SNR>100 dB, Dashed line SNR=20 dB, Dash-dotted SNR=12 dB and Dotted SNR=6 dB.

The performance of the method according to the invention is reduced when an interfering signal (noise or other GMSK-signal) is added to the wanted signal. This is not a big problem, because the performance will mainly be set by the fact that an interfering signal is present. For high SNR and C/I the homodyne radio receiver apparatus according to the invention suppresses the remaining limiting factor, which is the error in the DC-calculation.

The relationship between the error in the calculation of the DC-level and the performance degradation is progressive. This causes a substantial reduction of the number of bit errors even for a small improvement in the DC-level calculation, which is shown by the two graphs in FIG. 6.

Consequently, by considering information characteristics of the received signal burst and use it in the DC-level estimation, the DC-level error can be considerably reduced for high C/I (carrier-to-interference ratio) and SNR (signal-to-noise ratio) signal conditions.

Even though, any interfering signal or distortion from the receiver filters reduces the performance, the resulting DC-level estimation according to the invention is still satisfying for most applications.

The optimum slope is flat, which makes it possible to implement the DC-level estimation with a fix number of the compensation factor, for example −2.0.

It has been shown that the difference between the number of samples with an amplitude value above/below a fix limit is strongly correlated with the DC-error, and therefore this is used in a second embodiment of the invention.

Figure 1B:
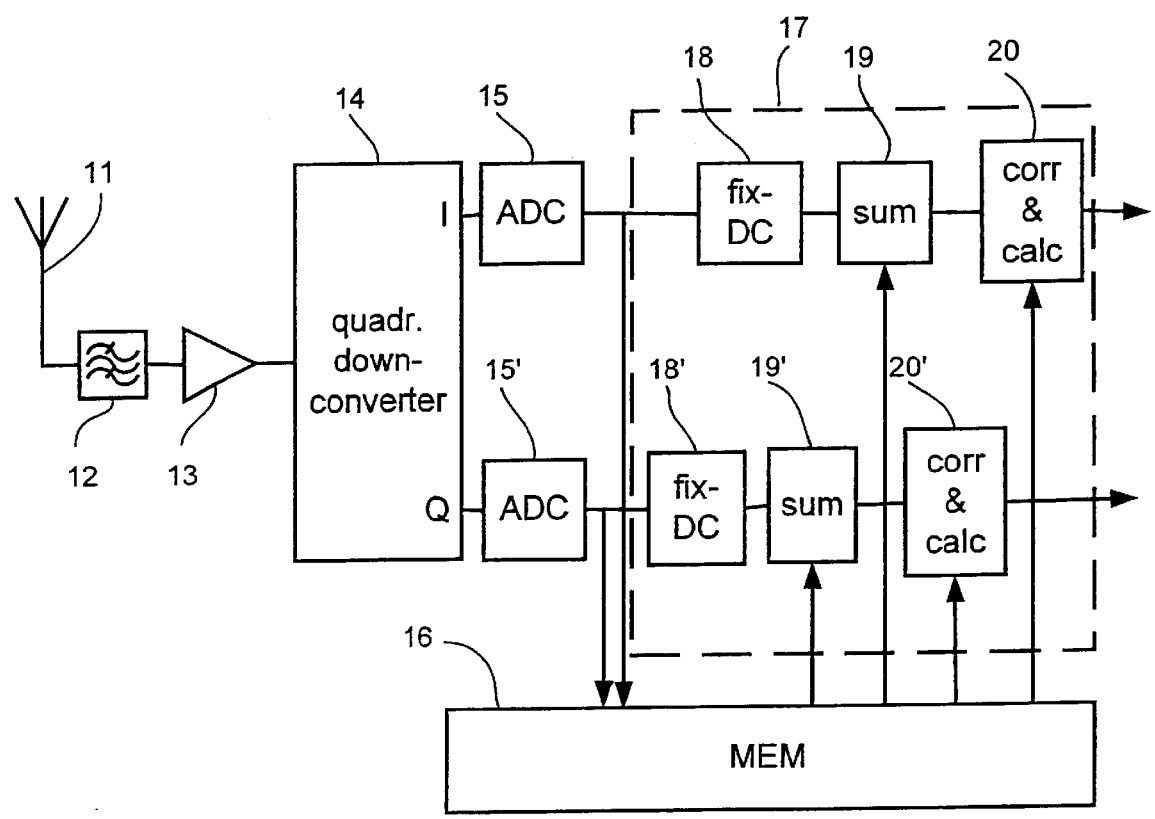
FIG. 1B is a block diagram of a second embodiment of a homodyne receiver according to the invention.

With reference to FIG 1B, a signal burst containing a number of symbols, including a carrier signal modulated by a modulating signal, is received by an antenna 11 and is filtered by a bandpass filter 12. An amplifier 13 amplifies the filtered signal generated by the filter 12. Further, the amplified signal burst is down-converted to complex base band signals I (in-phase) and Q (quadrature) by a conventional quadrature down-converter 14. The output I, Q from the down-converter 14 is preferably filtered and amplified by additional filters and amplifiers before the output is sampled and converted to a digital signal by an analog-to-digital converter ADC 15,15'. The digital signal may be filtered in a digital filter, and the digital data symbols or samples contained in the signal are supplied to a digital memory 16 for later retrieval.

The output from the ADC 15,15' is fed to a DC compensation device 17, which determines a DC-level estimate of the received signal and subtracts the determined DC-level from the signal burst before it is demodulated. In order to determine the DC-level estimate the DC compensation device is adapted to process the received signal burst in a plurality of steps according the second embodiment of the invention. The output of the ADC 15,15' is fed to an average calculator 18,18', which estimates the average DC-level of a number of samples, subtracts the estimated DC level from each sample before they are fed to the next step. Additionally, the average calculator 18,18' determines the peak value of the signal by identifying the maximal sample value and subtracting the estimated average DC-level from the maximal sample value. The peak value is supplied to the next step of the signal path together with the estimated average DC-level.

The next step in the signal path is a signed sum calculator 19,19'. The digital data symbols or samples of the received signal burst stored in the digital memory 16 are read by the signed sum calculator 19,19', which standardizes the symbols with reference to the estimated average DC-level and the peak value before a signed sum of the samples are calculated and weighted by a compensation factor, described later.

The output of the signed sum calculator 19,19' is supplied to a correction and calculator block 20,20', in which an improved DC-level estimate is calculated by subtracting the weighted calculated signed sum from the estimated average DC-level. Finally, the improved DC-level estimate is subtracted from each sample read from the memory 16.

Consequently, the output of the correction and calculator block 20,20' at the end of the signal path will finally provide a stream of digital data symbols, that were contained in and carried by the analog signal initially received at the antenna 1, but compensated by the DC-level, resulting from the estimation as described.

Thus, in this embodiment of the invention, the DC-level is estimated according to the following expression (5) for the compensation:

$$DC_{estimate2} = DC_{average} - B \cdot DC_{error2} \quad (5), \text{wherein}$$

$$DC_{average} = \frac{1}{N}\sum_{i=1}^{N} S(i), \quad \text{and} \tag{2}$$

$$DC_{error2} = \sum_{M} y \tag{6}$$

Thus, the estimated DC-level, $DC_{estimate2}$, is the average DC-level, $DC_{average}$, calculated over N symbols S(i) compensated by a DC-error, $DC_{error2}$, which is multiplied by a compensation factor B. The DC-error is estimated by calculating the signed sum of the signal, calculated over M symbols S(j), wherein $y=S(j)-DC_{average}$.

Figure 9:
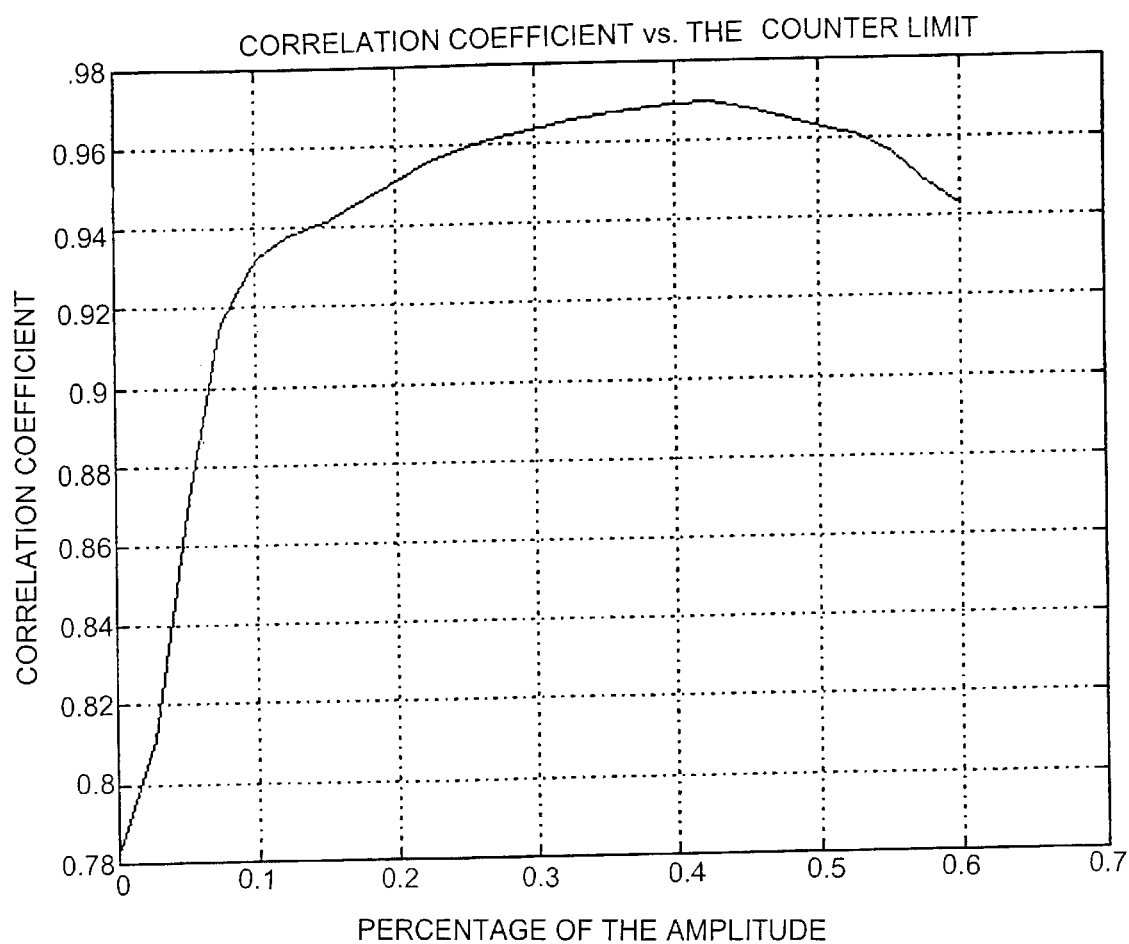
FIG. 9 is a plot of the correlation coefficient versus the counter limit.

A plot of the correlation coefficient versus the counter limit, the percentage of the amplitude, is shown in FIG. 9. An optimal correlation is achieved if only samples (S(j)) above/below 30–50% and preferably 40% of the amplitude is used for the calculations of the difference of the number of positive and negative samples. The error in the DC-level estimate makes the samples close to the DC-level more uncertain and therefore a higher limit is preferable. However, a higher limit decreases the number of samples available for the calculations. As mentioned above, the flatness of the optimum indicates that the compensation factor is noise tolerant.

An optimal compensation factor is determined for different C/I (carrier-to-interference ratio) and SNR (signal-to-noise ratio), assuming white noise.

Figure 10:
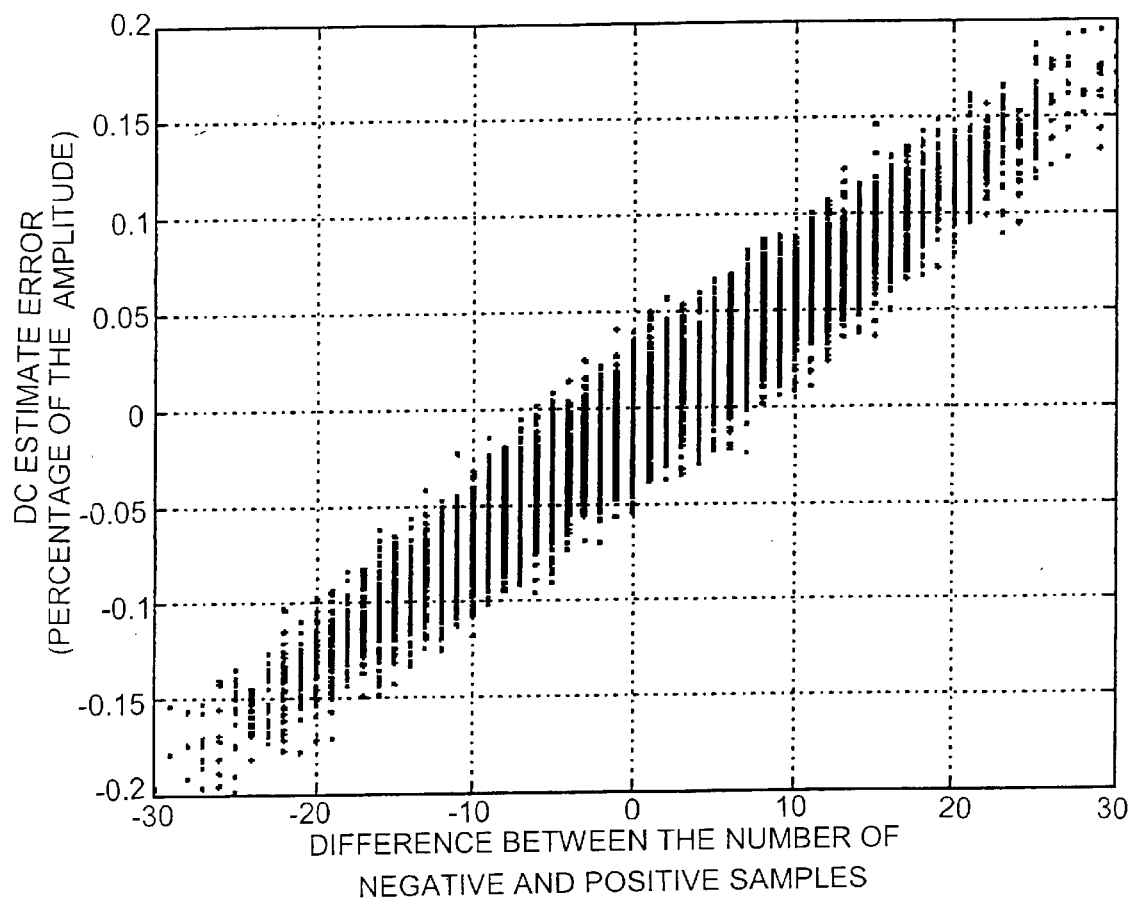
FIG. 10 shows the DC estimate error as a function of the difference between the number of negative and positive samples.
Figure 11:
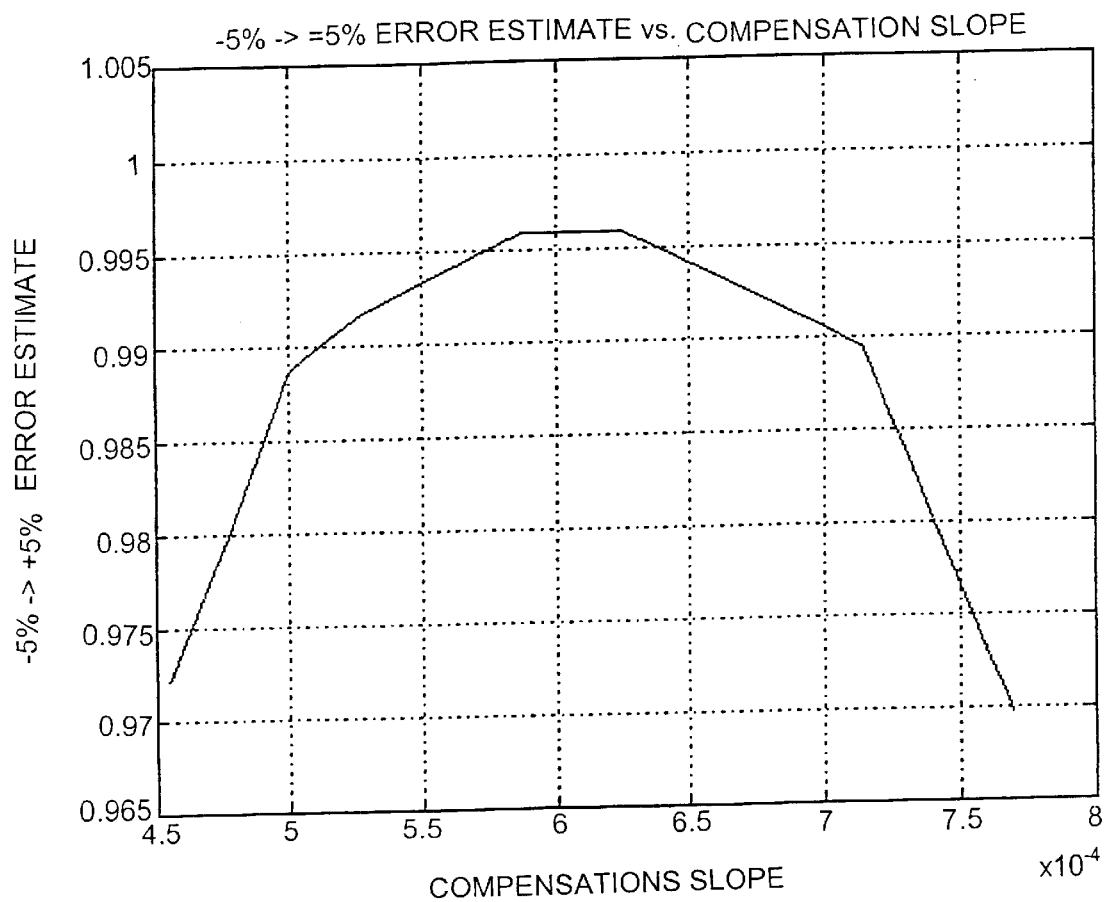
FIG. 11 shows −5 to +5% error estimate vs. the compensation slope.

FIG. 10 shows the DC estimate error, as a percentage of the amplitude, as a function of the difference between the number of negative and positive samples, and FIG. 11 shows −5 to +5% error estimate as a function of the compensation slope.

It is apparent from the graph in FIG. 10 that a compensation factor of 0.0055–0.0065 and preferably 0.006 is the optimal relationship between the DC-error and the signed sum. Thus, the following expression is an example of a compensation expression used by the DC compensation device 4 for determining a DC-level estimate if only samples (y in the expression (6)) above/below 40% of the amplitude is used for the calculations.

$$i\ DC_{estimate2} = DC_{average} - 0.006 \cdot DC_{error2} \tag{5, wherein}$$

The flatness of the optimum indicates that this parameter also is noise tolerant.

Figure 12:
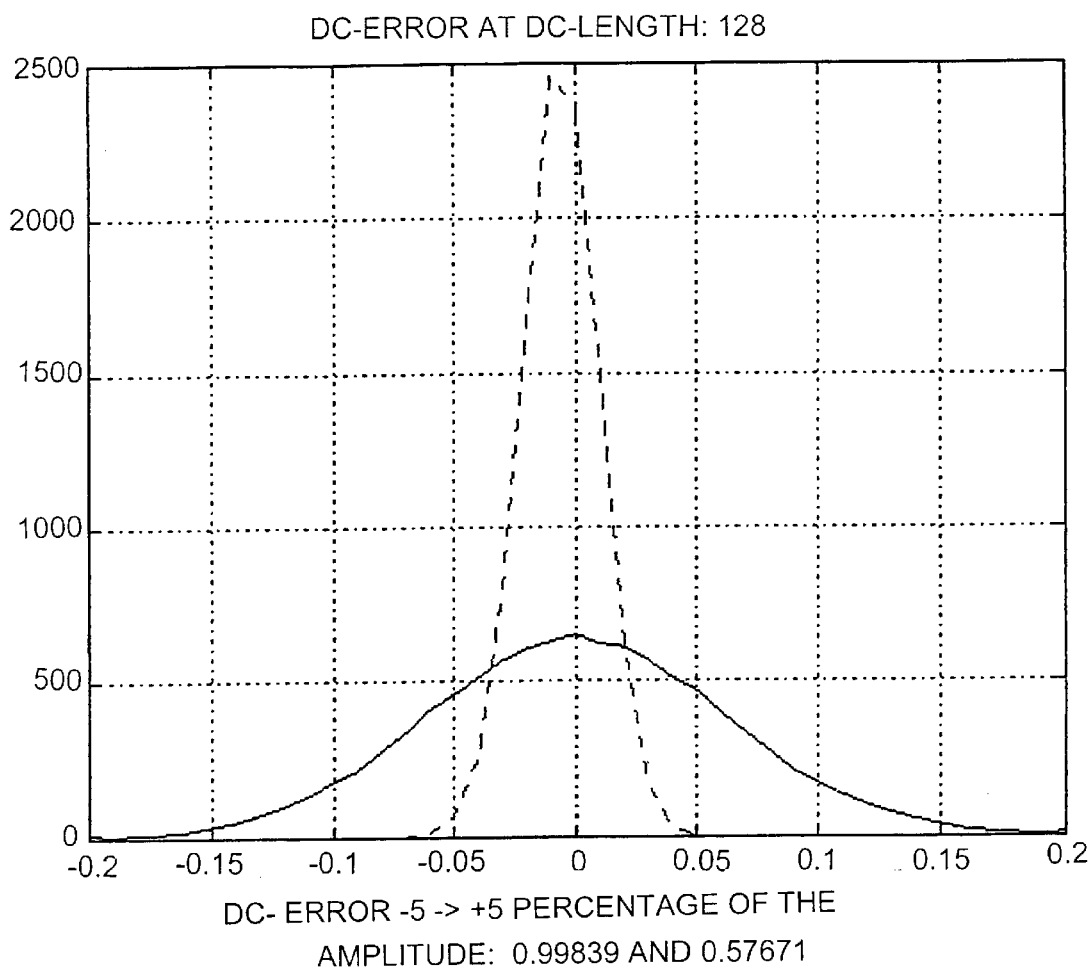
FIG. 12 is a plot of the probability function for the DC error with and without compensation.

The probability functions for the DC error (as percentage of the amplitude) estimated from a burst of 128 symbols for C/I>100 dB are illustrated in FIG. 12. The solid line illustrates the probability function without compensation and the dashed line illustrates the probability function with a compensation slope value of 0.006.

Consequently, by considering information characteristics of the received signal burst and using only samples above/below a certain percentage of the amplitude is used for the DC-level estimation, the DC-level error can be considerably reduced for high C/I (carrier-to-interference ratio) and SNR (signal-to-noise ratio) signal conditions.

Although the invention has been described by way of a specific embodiments thereof it should be apparent that the present invention provides an improved DC estimate method and a homodyne radio receiver apparatus that fully satisfies the aims and advantages set forth above, and alternatives, modifications and variations are apparent to those skilled in the art.

The DC-compensation device is a digital signal-processing device preferably implemented as a hard-wired logic circuitry for the speed performance. However, the DC-compensation device can be implemented as an ASIC integrated digital signal processor in an alternative embodiment of the invention.

Further systems like EDGE and AMR have some coding scheme that relays one good signal condition. One single bit error will force a retransmission of a large block and will therefore reduce the data throughput.

What is claimed is:

1. A homodyne radio receiver apparatus, comprising a homodyne radio receiver device (1,2,3,4,5,5') for receiving radio frequency signal bursts of a number of symbols and generating digital samples of at least a complex base band signal (I and Q) of each signal burst, and DC compensation means (7) operatively connected to said homodyne radio receiver device (1,2,3,4,5,5') for determining a DC-level estimate of said samples, wherein said DC compensation means (7) comprises average calculator means (8,8') for calculating an average DC-level of said samples, characterized in that said DC compensation means (7) further comprises signed square sum calculator means (9,9') for calculating a signed square sum of a plurality of said samples and weighting said square sum by a compensation factor (A), and correction means (10,10') for subtracting an output of said square sum calculator means (9,9') from an output of said average calculator means (8,8') for forming said DC-level estimate.

2. A homodyne radio receiver apparatus according to claim 1, characterized in that said compensation factor (A) is −1 to −3.

3. A homodyne radio receiver apparatus, comprising a homodyne radio receiver device (11,12,13,14,15,15') for receiving radio frequency signal bursts containing a number of symbols and generating digital samples of at least a complex base band signal (I and Q) of each signal burst, and DC compensation means (17) operatively connected to said homodyne radio receiver device (11,12,13,14,15,15') for determining a DC-level estimate of said samples, wherein said DC compensation means (17) comprises average calculator means (18,18') for calculating an average DC-level of said samples, characterized in that said DC compensation means (7) further comprises signed sum calculator means (19,19') for calculating a signed sum or a plurality of said samples and weighting said sum by a compensation factor, and correction means (20,20') for subtracting an output of said signed sum calculator means (19,19') from an output of said average calculator means (18,18') for forming said DC-level estimate.

4. A homodyne radio receiver apparatus according to claim 3, characterized in that said samples having an amplitude value of at least 40% of the amplitude of said modulating signal.

5. A homodyne radio receiver apparatus according to claim 4, characterized in that said compensation factor is 0.0055–0.0065.

6. A homodyne radio receiver apparatus according to claim 1, characterized in that said DC compensation means (7;17) is a digital signal processing device.

7. A homodyne radio receiver apparatus according to claim 1, characterized in that said homodyne radio receiver device comprises signal receiver means (1,2,3;11,12,13) operatively connected to a quadrature down-converter (4;14) for down-converting said signal burst to at least a complex base band signal (I and Q), and an analog-to-digital converter (5,5';15,15') for generating said samples.

8. A homodyne radio receiver apparatus according to claim 1, characterized in that said correction means (10,

10';20,20') is adapted to subtract said DC-level estimate from each sample.

9. A signal processor for compensating a DC-level of a radio frequency signal bursts received in a homodyne radio receiver, comprising signal receiving means for receiving digital samples of at least a complex base band signal (I and Q) generated by said homodyne radio receiver, DC compensation means (7) for determining a DC-level estimate of said samples, average calculator means (8,8') for calculating an average DC-level of said samples, characterized by signed square sum calculator means (9,9') for calculating a signed square sum of a plurality of said samples and weighting said square sum by a compensation factor, and correction means (10,10') for subtracting an output of said square sum calculator means (9,9') from an output of said average calculator means (8,8') for forming said DC-level estimate.

10. A signal processor according to claim 9, characterized in that said compensation factor is −1 to −3.

11. A signal processor for compensating a DC-level of a radio frequency signal bursts received in a homodyne radio receiver, comprising signal receiving means for receiving digital samples of at least a complex base band signal (I and Q) generated by said homodyne radio receiver, DC compensation means (17) for determining a DC-level estimate of said samples, average calculator means (18,18') for calculating an average DC-level of said samples, characterized by signed sum calculator means (19,19') for calculating a signed sum of a plurality of said samples and weighting said sum by a compensation factor, and correction means (20,20') for subtracting an output of said signed sum calculator means (19,19') from an output of said average calculator means (18,18') for forming said DC-level estimate.

12. A signal processor according to claim 11, characterized in that said samples having an amplitude value of at least 40% of the amplitude of said modulating signal.

13. A signal processor according to claim 12, characterized in that said compensation factor is 0.0055–0.0065.

14. A signal processor according to claim 9 characterized in that said homodyne radio receiver device comprises signal receiver means (1,2,3;11,12,13) operatively connected to a quadrature down-converter (4;14) for down-converting said signal burst to at least a complex base band signal (I and Q), and an analog-to-digital converter (5,5';15, 15') for generating said samples.

15. A signal processor according to claim 9, characterized in that said correction means (10,10';20,20') is adapted to subtract said DC-level estimate from each sample.

16. A method of DC-level estimation in a homodyne radio receiver apparatus, wherein a radio frequency signal burst containing a number of symbols is received in the apparatus, digital samples of at least a complex base band signal (I and Q) of each signal burst are generated, and an average DC-level estimate of said samples is determined, characterized by the further steps of:

determining a signed square sum of a plurality of said samples and weighting said square sum by a compensation factor, and subtracting said signed square sum from said average DC-level for forming said DC-level estimate.

17. A method according to claim 16, characterized in that said compensation factor is −1 to −3.

18. A method of DC level estimation in a homodyne radio receiver apparatus, wherein a radio frequency signal burst containing a number of symbols is received in the apparatus, digital samples of at least a complex base band signal (I and Q) of each signal burst are generated, and an average DC-level estimate of said samples is determined, characterized by the further steps of:

determining a signed sum of a plurality of said samples and weighting said signed sum by a compensation factor, and subtracting said weighted signed sum from said averaged DC-level for forming said DC-level estimate.

19. A method according to claim 18, characterized in that said compensation factor is 0.0055–0.0065.

20. A method according to claim 18, characterized in that said compensation factor is 0.006.

* * * * *

UNITED STATES PATENT AND TRADEMARK OFFICE
CERTIFICATE OF CORRECTION

PATENT NO. : 6,654,596 B1
DATED : November 25, 2003
INVENTOR(S) : Jakobsson, Jan Peter et al.

It is certified that error appears in the above-identified patent and that said Letters Patent is hereby corrected as shown below:

<u>Column 8,</u>
Line 42, delete "(7)" and insert therefore -- (17) --.
Line 58, delete "(7;17)" and insert therefor -- (7) --.
Line 67, delete "(10,10';20,20')" and insert therefore -- (10,10') --.

<u>Column 9,</u>
Line 1, delete "(10,10';20,20')" and insert therefore -- (10,10') --.

<u>Column 10,</u>
Line 7, delete "(10,10';20,20')" and insert therefore -- (10,10') --.

Signed and Sealed this

Twenty-ninth Day of June, 2004

JON W. DUDAS
*Acting Director of the United States Patent and Trademark Office*